United States Patent
Stocker

(10) Patent No.: US 11,143,726 B2
(45) Date of Patent: Oct. 12, 2021

(54) CABLE FOR OPERATING A GRADIENT COIL OF A MAGNETIC RESONANCE APPARATUS

(71) Applicant: Stefan Stocker, Großenseebach (DE)

(72) Inventor: Stefan Stocker, Großenseebach (DE)

(73) Assignee: Siemens Healthcare GmbH, Erlangen (DE)

( * ) Notice: Subject to any disclaimer, the term of this patent is extended or adjusted under 35 U.S.C. 154(b) by 217 days.

(21) Appl. No.: 15/630,698

(22) Filed: Jun. 22, 2017

(65) Prior Publication Data

US 2017/0371013 A1 Dec. 28, 2017

(30) Foreign Application Priority Data

Jun. 23, 2016 (DE) .......................... 102016211263.5

(51) Int. Cl.
*G01R 33/385* (2006.01)
*G01R 33/422* (2006.01)

(52) U.S. Cl.
CPC ........ *G01R 33/385* (2013.01); *G01R 33/3854* (2013.01); *G01R 33/3858* (2013.01); *G01R 33/422* (2013.01)

(58) Field of Classification Search
None
See application file for complete search history.

(56) References Cited

U.S. PATENT DOCUMENTS

| 5,451,718 A * | 9/1995 | Dixon | H01B 7/285 156/54 |
| 2003/0141870 A1* | 7/2003 | Schuster | G01R 33/3856 324/318 |
| 2012/0118630 A1* | 5/2012 | Jiang | G01R 33/36 174/74 R |
| 2013/0278264 A1* | 10/2013 | Boskamp | G01R 33/3685 324/318 |

FOREIGN PATENT DOCUMENTS

CN 203150156 U 8/2013

OTHER PUBLICATIONS

German Office Action for related German Application No. 10 2016 211 263.5 dated Mar. 21, 2017, with English Translation.

* cited by examiner

*Primary Examiner* — Douglas X Rodriguez
(74) *Attorney, Agent, or Firm* — Lempia Summerfield Katz LLC

(57) ABSTRACT

A cable for operating a gradient coil of a magnetic resonance apparatus, a magnetic resonance apparatus, and a method for manufacturing a cable for operating a gradient coil of a magnetic resonance apparatus are provided. The cable includes at least one electric conductor and a stabilizing sheathing that surrounds the at least one electric conductor at least partially.

17 Claims, 2 Drawing Sheets

CABLE FOR OPERATING A GRADIENT COIL OF A MAGNETIC RESONANCE APPARATUS

This application claims the benefit of DE 10 2016 211 263.5, filed on Jun. 23, 2016, which is hereby incorporated by reference in its entirety.

BACKGROUND

The present embodiments relate to a cable for operating a gradient coil of a magnetic resonance apparatus, a magnetic resonance apparatus, and a method for manufacturing a cable for operating a gradient coil of a magnetic resonance apparatus.

Magnetic resonance tomography (MRT) or magnetic resonance imaging (MRI) is a known technology for generating images of a body interior of an examination object, which is based upon the physical phenomenon of magnetic resonance (MR). Typically, for this purpose, during a magnetic resonance examination in a magnetic resonance apparatus, a static main magnetic field is overlaid with gradient pulses that are generated with the aid of gradient coils. Normally, for the operation of a gradient coil in a magnetic resonance apparatus, rapidly switched electric currents of several hundred Ampere are to be provided.

The current conductors to the gradient coils usually extend in the leakage area of the main magnetic field and therefore experience Lorentz forces. Without special measures to contain or minimize these forces, these gradient connection cables would oscillate severely and possibly suffer a fatigue breakage.

According to the prior art, a panel of fiber-based laminate or of aluminum is provided with a guide groove into which one or more electric conductors are laid. The grooves are filled with epoxy resin in order to connect the conductor to the panel. However, this method of manufacturing is highly complex.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a cable that is simpler and more economical to manufacture, but withstands enduring oscillation bending loading is provided. A cable for operating a gradient coil of a magnetic resonance apparatus that includes at least one electric conductor and a stabilizing sheathing that at least partially surrounds the at least one electric conductor is provided.

The stabilizing sheathing is configured to counteract the forces that arise. The Lorentz forces typically acting in an alternating direction on the electric conductor are contained by a mechanically sufficiently stable stabilizing sheathing of the cable, and/or severe vibrations are suppressed.

The electric conductor may be configured to enable a current flow between the gradient coil and a current source of the gradient coil. The electric conductor may include a material with a high electrical conductivity (e.g., copper and/or aluminum) in order to enable a transport of large electric currents.

In one embodiment, the cable has (e.g., at ends) at least one connecting unit (e.g., for electric contacting of the cable to a gradient coil and/or a current source of the gradient coil). These current contacts may be configured, for example, as screw-fastened, cable lugs and/or screw connections.

The electric conductor may include an insulating material that surrounds an electrically conductive material. A plurality of independent (e.g., not short-circuited) feed lines may thus be integrated into the cable.

Usually, the cable has a longitudinal direction parallel to a cable longitudinal axis and a peripheral direction that is oriented round the cable longitudinal axis. The longitudinal direction may thus also be regarded as an axial direction of the cable.

That the stabilizing sheathing at least partially surrounds the at least one electric conductor may provide, for example, that there are one or more first portions parallel to the cable longitudinal axis in which the stabilizing sheathing surrounds the at least one electric conductor (e.g., in the peripheral direction), and/or one or more second portions in which the stabilizing sheathing does not surround the at least one electric conductor. In one embodiment, the stabilizing sheathing surrounds the electric conductor in the peripheral direction at least partially in the first portions (e.g., completely).

In one embodiment, the stabilizing sheathing has a material with an elastic modulus, at a temperature of 20° C., of more than 1 GPa (e.g., more than 3 GPa or more than 10 GPa). For example, the stabilizing sheathing may consist entirely of one or more materials that have such an elastic modulus.

The stabilizing sheathing may have a significantly greater stiffness than materials of conventional cable sheaths. In contrast to the proposed stabilizing sheathing, conventional cable sheaths are usually particularly flexible in order to enable low bending radii. Therefore, a high degree of stiffness is herein not desired at all.

The elastic modulus may also be designated the modulus of stretch, the coefficient of elasticity, the tensile modulus, and/or Young's modulus (E modulus) and is typically given in the units Pascal or $N/m^2$. A component made of a material with a high elastic modulus is normally stiffer than a component of the same design that consists of a material with a low elastic modulus. Therefore, for example, a material with a high elastic modulus is suitable as the material for the stabilizing sheathing.

In one embodiment, the stabilizing sheathing includes copper and/or non-magnetic steel and/or aluminum and/or plastics. For example, the stabilizing sheathing consists entirely of one or more of the materials mentioned. Such materials are particularly suited to absorbing any vibrations of the gradient coils.

In the case of plastics (e.g., a thermoplastic), plastics material is proposed since this is particularly suitable for entering into a stabilizing connection with the electric conductor.

The stabilizing sheathing may be configured tubular so that the stabilizing sheathing may also be conceived as a stabilizing support tube and/or a carrier tube for the at least one electric conductor. A geometry of this type enables simple manufacturing since the electric conductor may be easily threaded and/or introduced into a tube.

In one embodiment, the stabilizing sheathing has a wall thickness of between 0.2 and 5 mm (e.g., 0.5 to 3 mm). Such wall thicknesses represent an advantageous compromise between a sufficient stiffness and an acceptable weight and/or material usage.

In one embodiment, the at least one electric conductor includes a stranded lead (e.g., a wire braided from individual wires). Stranded leads may have a high degree of flexibility in order to be able, for example, to withstand vibrations at the contact points with the gradient coil and/or a terminal plate.

One embodiment of the cable provides that the cable has a plurality of electric conductors. For example, a feed conductor and a return conductor may be brought together in a pair. This arrangement is advantageous from the aspect of forces, since the Lorentz forces at least partially cancel out.

The plurality of electric conductors may be arranged, for example, twisted together and/or coaxially. With a twisted arrangement, the resulting Lorentz force may be minimized.

In one embodiment, the stabilizing sheathing has at least one connecting portion parallel to the cable longitudinal axis. Using the at least one connecting portion, a stable connection may be created between the at least one electric conductor and the stabilizing sheathing.

In one embodiment, the at least one connecting portion has a form-fitting connection (e.g., a crimp connection and/or a shrink connection) between the at least one electric conductor and the stabilizing sheathing.

A crimp connection is typically a connection that is created by crimping. In this case, crimping may be a joining together of the at least one electric conductor with the stabilizing sheathing by plastic deformation of the stabilizing sheathing (e.g., by flanging, squeezing, curling, or folding).

A possible thermoplastic stabilizing sheathing may bring about a form-fit between the at least one electric conductor and the stabilizing sheathing by hot deformation. In this way, for example, a shrink connection may be generated.

The at least one connecting portion may extend over the entire length of the cable or merely over a part thereof. For example, the at least one connecting portion may have a length parallel to the cable longitudinal axis that lies between 0.1 times and 10 times (e.g., between 0.2 times and 2 times) the diameter of the cable. By this, stable connections may be created between the at least one electric conductor and the stabilizing sheathing.

In one embodiment, the stabilizing sheathing has, parallel to the cable longitudinal axis, two or more connecting portions that are spaced by a length that lies between 0.5 times and 10 times (e.g., between 1 times and 5 times) the diameter of the cable. Using such a configuration, a sufficiently stable connection may be created between the at least one electric conductor and the stabilizing sheathing.

One embodiment of the cable provides that the cable has at least one sheathing-free portion parallel to the cable longitudinal axis in which no stabilizing sheathing is arranged. Dispensing with the stabilizing sheathing in this at least one sheathing-free portion advantageously leads to a greater flexibility in this region.

In one embodiment, at least one of the at least one sheathing-free portions is arranged at the cable end side. For example, in a transition region of a connection to the oscillating gradient coil, a higher degree of flexibility is advantageous in order to compensate for mechanical tolerances and/or to conduct vibrations to subsequent components without, for example, sustaining a fatigue fracture.

In one embodiment, the at least one sheathing-free portion has a length axially parallel to the cable longitudinal axis that is at least as large (e.g., at least twice as large) as the diameter of the cable. A length dimensioned thus provides, for example, an advantageous flexibility at the cable ends.

A magnetic resonance apparatus with at least one cable for operating a gradient coil is provided, as described above. The advantages of the cable according to the present embodiments for operating a gradient coil substantially correspond to the advantages of the magnetic resonance apparatus according to the present embodiments.

In one embodiment, the magnetic resonance apparatus has a system ground. The stabilizing sheathing is electrically conductive and is electrically connected to the system ground. For this purpose, the stabilizing sheathing may include at least one connecting unit for connecting the stabilizing sheathing to the system ground of the magnetic resonance apparatus.

The stabilizing sheathing may thus additionally serve as screening so that, for example, any electrostatic charges may be conducted away to the system ground. This reduces the risk of interfering signals (e.g., spikes) that may be caused, for example, by discharges received by the magnetic resonance apparatus. Possible image artifacts may thus be minimized.

Also provided is a method for manufacturing a cable for operating a gradient coil of a magnetic resonance apparatus. The method includes feeding at least one electric conductor into a stabilizing sheathing (e.g., a tube). A form-fitting connection is then created between the stabilizing sheathing and the at least one electric conductor. The form-fitting connection may take place, for example, by crimping and/or hot-forming (e.g., using a heated crimping tool). The ends of the at least one electric conductor may each be provided, for example, with a cable lug.

The minimized number of components in comparison with the prior art and the short process times in the manufacturing reduce the manufacturing costs.

Otherwise, with regard to the method, reference is made to the features and advantages that have already been described in the context of the description of embodiments of the cable.

BRIEF DESCRIPTION OF THE DRAWINGS

Parts that correspond to one another are provided with the same reference signs in all the drawings.

DETAILED DESCRIPTION

Figure 1:
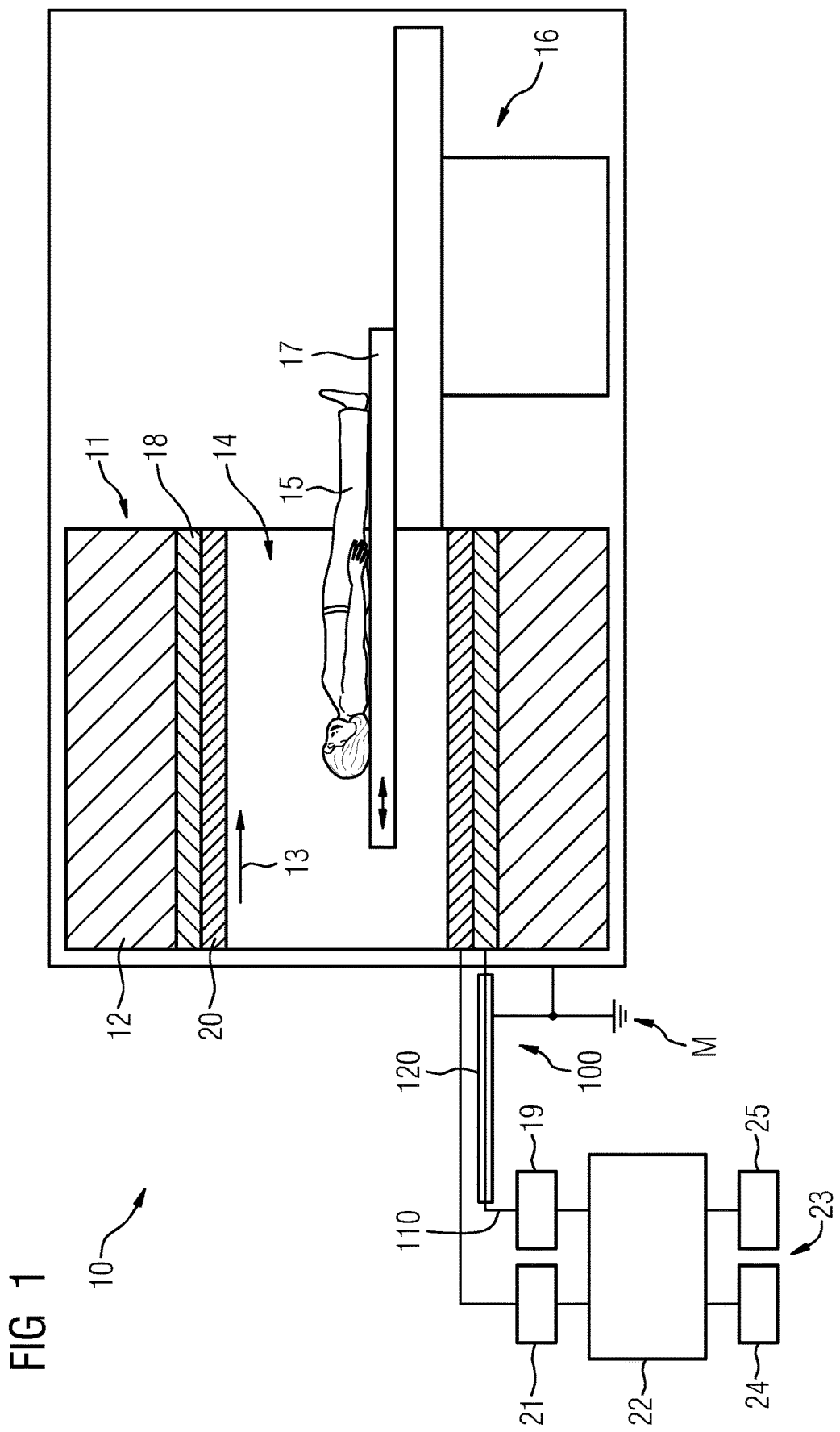
FIG. 1 is a schematic representation of one embodiment of a magnetic resonance apparatus with a cable for operating a gradient coil.

FIG. 1 shows schematically one embodiment of a magnetic resonance apparatus 10. The magnetic resonance apparatus 10 has a magnet unit 11 that includes a superconducting main magnet 12 for generating a strong and, for example, temporally constant main magnetic field 13. In addition, the magnetic resonance apparatus 10 has a patient accommodating region 14 to accommodate a patient 15. In the present exemplary embodiment, the patient accommodating region 14 is configured cylindrical and is surrounded cylindrically in a peripheral direction by the magnet unit 11. A configuration of the patient accommodating region 14 deviating therefrom may, however, be provided. The patient 15 may be pushed by a patient support apparatus 16 of the magnetic resonance apparatus 10 into the patient accommodating region 14. For this purpose, the patient support apparatus 16 has a patient table 17 that is configured to be movable within the patient accommodating region 14.

The magnet unit 11 also has a gradient coil unit 18 for generating magnetic field gradients that are used for position encoding during an imaging process. The gradient coil unit 18 includes, for example, three gradient coils (not shown in detail). The gradient coil unit 18 is controlled by a gradient control unit 19 of the magnetic resonance apparatus 10. In order to operate the gradient coils of the gradient coil unit 18, the magnetic resonance apparatus 10 has at least one cable 100. The cable 100 includes an electric conductor 110 and a stabilizing sheathing 120 that at least partially surrounds the at least one electric conductor. The stabilizing sheathing 120 is electrically conductive in this example and is connected to the system ground M. Using this, the stabilizing sheathing 120 acts in a screening manner against interfering signals from outside.

The magnet unit 11 further includes a high frequency antenna unit 20 that is configured in the present exemplary embodiment as a body coil that is firmly integrated into the magnetic resonance apparatus 10. The high frequency antenna unit 20 is configured for an excitation of atomic nuclei, which arises in the main magnetic field 13 generated by the main magnet 12. The high frequency antenna unit 20 is controlled by a high frequency antenna control unit 21 of the magnetic resonance apparatus 10 and radiates high frequency magnetic resonance sequences into an examination space that is substantially formed by a patient accommodating region 14 of the magnetic resonance apparatus 10. The high frequency antenna unit 20 is also configured for the receiving of magnetic resonance signals.

The gradient control unit 19, for controlling the main magnet 12, and the magnetic resonance apparatus 10, for controlling the high frequency antenna control unit 21, have a system control unit 22. The system control unit 22 centrally controls the magnetic resonance apparatus 10 (e.g., the execution of a pre-determined imaging gradient echo sequence). The system control unit 22 includes an evaluation unit (not shown in detail) for evaluating medical image data that is acquired during the magnetic resonance examination. The magnetic resonance apparatus 10 includes a user interface 23 that is connected to the system control unit 22. Control information such as, for example, imaging parameters and reconstructed magnetic resonance images may be displayed on a display unit 24 (e.g., on at least one monitor) of the user interface 23 for medical operating personnel. In addition, the user interface 23 has an input unit 25 by which information and/or parameters may be input by the medical operating personnel during a scanning procedure.

Figure 2:
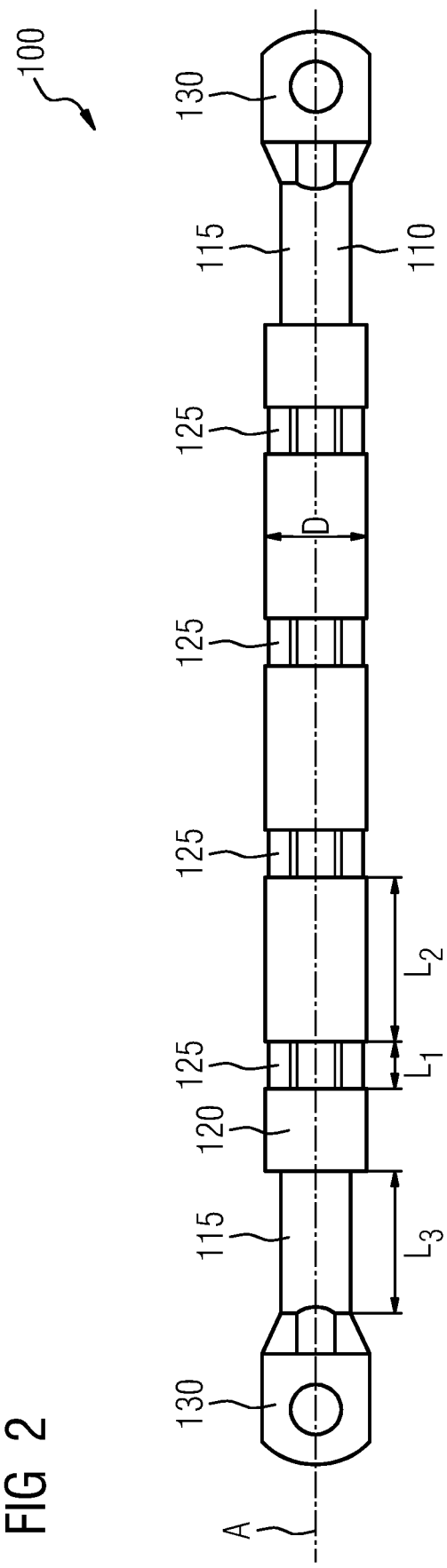
FIG. 2 is a schematic representation of one embodiment of a cable for operating a gradient coil.

FIG. 2 shows an exemplary cable 100 for operating a gradient coil of a magnetic resonance apparatus 10. Apart from the electric conductor 110 and the stabilizing sheathing 120 that partially surrounds the electric conductor 110, the cable 100 includes a cable lug 130 at each end, which is connected to the electric conductor 110.

The stabilizing sheathing 120 serves to stiffen the cable 100 in a targeted manner in order, for example, to damp possible vibrations emanating from the gradient coils and thus to reduce the risk of a breakage of the electric conductor 110.

In order to achieve an effective stiffening effect, the stabilizing sheathing 120 includes a material with an elastic modulus, at a temperature of 20° C., of more than 1 GPa. The stabilizing sheathing 120 may further include copper, non-magnetic steel, aluminum, thermoplastic, plastics, or any combination thereof.

In this exemplary embodiment, the cable 100 includes only one electric conductor 110, which may be configured, for example, as stranded lead. In one embodiment, the cable includes a plurality of electric conductors. The plurality of electric conductors may be arranged, for example, twisted together and/or coaxially. Since the contacting of the outer conductor in a coaxial arrangement may require a great effort, dispensing with the coaxial arrangement for systems that are operated with less high currents may represent a very economical alternative.

The stabilizing sheathing 120 has a plurality of connecting portions 125 parallel to the cable longitudinal axis A. The connecting portions 125 provide for a connection between the electric conductor 110 and the stabilizing sheathing 120. For example, the connection may be created by crimping so that the connecting portions 125 are crimp sites.

The stabilizing sheathing 120 is configured as tubular, and the tube is narrowed at the crimp sites 125 and enters into a form-fitting connection with the electric conductor 110. The tube has a wall thickness of, for example, between 0.2 and 5 mm.

The connecting portions 125 may have a length $L_1$ parallel to the cable length axis A of between 0.1 times and 10 times the diameter D of the cable 100. In one embodiment, the connecting portions 125 have a spacing $L_2$ from one another of between 0.5 times and 10 times the diameter D of the cable 100.

At the ends, the cable 100 has two sheathing-free portions 115 in which no stabilizing sheathing 120 is arranged. These sheathing-free portions 115 may be at least as large as the diameter of the cable D (e.g., $L_3 \geq D$).

Figure 3:
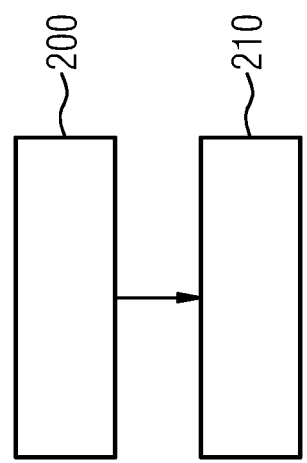
FIG. 3 is a block diagram of one embodiment of a method for manufacturing a cable for operating a gradient coil.

FIG. 3 illustrates one embodiment of a method for manufacturing a cable 100 for operating a gradient coil of a magnetic resonance apparatus 10. In act 200, at least one electric conductor 110 is introduced into a stabilizing sheathing 120. In act 210, a form-fitting connection is created between the stabilizing sheathing 120 and the at least one electric conductor 110. Act 210 may take place, for example, using crimping and/or hot forming.

The method described above in detail and the cable and the magnetic resonance apparatus disclosed are merely exemplary embodiments that may be modified by a person skilled in the art in a wide variety of ways without departing from the scope of the invention. Further, the use of the indefinite article "a" or "an" does not preclude that the relevant features may also be present plurally. Similarly, the expression "unit" does not preclude the relevant components consisting of a plurality of cooperating subcomponents that may also be spatially distributed if necessary.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A cable for operating a gradient coil of a magnetic resonance apparatus, the cable comprising:
    at least one electric conductor configured to enable a current flow between the gradient coil and a current source of the gradient coil; and
    a stabilizing sheathing that surrounds the at least one electric conductor at least partially,
    wherein the stabilizing sheathing has at least one connecting portion parallel to a longitudinal axis of the cable, the at least one connecting portion being configured to provide a connection between the at least one electrical conductor and the stabilizing sheathing, and
    wherein a first outer surface of the stabilizing sheathing is radially inner relative to a second outer surface of the stabilizing sheathing, the first outer surface of the stabilizing sheathing being an outer surface of a connecting portion of the at least one connecting portion.

2. The cable of claim 1, wherein the stabilizing sheathing comprises a material with an elastic modulus at a temperature of 20° C. of more than 1 GPa.

3. The cable of claim 1, wherein the stabilizing sheathing comprises copper, nonmagnetic steel, aluminum, plastics, or any combination thereof.

4. The cable of claim 1, wherein the stabilizing sheathing has a wall thickness of between 0.2 and 5 mm.

5. The cable of claim 1, wherein the at least one electric conductor comprises a stranded lead.

6. The cable of claim 1, wherein the at least one electric conductor comprises a plurality of electric conductors that are twisted together, coaxially arranged, or twisted together and coaxially arranged.

7. The cable of claim 1, wherein the at least one connecting portion has a form-fitting connection.

8. The cable of claim 7, wherein the form-fitting connection includes a crimp connection, a shrink connection, or the crimp connection and the shrink connection between the at least one electric conductor and the stabilizing sheathing.

9. The cable of claim 1, wherein the at least one connecting portion has a length parallel to a cable longitudinal axis that lies between 0.1 times and 10 times a diameter of the cable.

10. The cable of claim 1, wherein the stabilizing sheathing has two or more connecting portions parallel to the cable longitudinal axis, and
    wherein the two or more connecting portions are spaced by a length that lies between 0.5 times and 10 times the diameter of the cable.

11. The cable of claim 1, wherein the cable has, parallel to a cable longitudinal axis, at least one sheathing-free portion in which no stabilizing sheathing is arranged.

12. The cable as claimed of claim 11, wherein one or more of the at least one sheathing-free portions is arranged at a cable end side.

13. The cable of claim 11, wherein the at least one sheathing-free portion has a length parallel to the cable longitudinal axis that is at least as large as the diameter of the cable.

14. A magnetic resonance apparatus comprising:
    at least one cable for operating a gradient coil of the magnetic resonance apparatus, a cable of the at least one cable comprising:
        at least one electric conductor configured to enable a current flow between the gradient coil and a current source of the gradient coil; and
        a stabilizing sheathing that surrounds the at least one electric conductor at least partially,
    wherein the stabilizing sheathing has at least one connecting portion parallel to a longitudinal axis of the cable, the at least one connecting portion being configured to provide a connection between the at least one electrical conductor and the stabilizing sheathing, and
    wherein a first outer surface of the stabilizing sheathing is radially inner relative to a second outer surface of the stabilizing sheathing, the first outer surface of the stabilizing sheathing being an outer surface of a connecting portion of the at least one connecting portion.

15. The magnetic resonance apparatus of claim 14, further comprising a system ground,
    wherein the stabilizing sheathing is electrically conductive and is electrically connected to a system ground.

16. A method for manufacturing a cable for operating a gradient coil of a magnetic resonance apparatus, the method comprising:
    introducing at least one electric conductor into a stabilizing sheathing, the at least one electric conductor being configured to enable a current flow between the gradient coil and a current source of the gradient coil, wherein the stabilizing sheathing has at least one connecting portion parallel to a longitudinal axis of the cable, the at least one connecting portion being configured to provide a connection between the at least one electrical conductor and the stabilizing sheathing, and wherein a first outer surface of the stabilizing sheathing is radially inner relative to a second outer surface of the stabilizing sheathing, the first outer surface of the stabilizing sheathing being an outer surface of a connecting portion of the at least one connecting portion; and
    creating at least one form-fitting connection between the stabilizing sheathing and the at least one electric conductor.

17. The method as claimed of 16, wherein the form-fitting connection is created by crimping, hot-forming, or crimping and hot-forming.

* * * * *